US010970316B1

(12) United States Patent
Khan et al.

(10) Patent No.: US 10,970,316 B1
(45) Date of Patent: Apr. 6, 2021

(54) MAINTAINING A CLASS HIERARCHY OF AN OBJECT-ORIENTED DATA MODEL USING SHARED COLUMNS AND/OR OVERFLOW TABLES

(71) Applicant: Bentley Systems, Incorporated, Exton, PA (US)

(72) Inventors: Affan Khan, Exton, PA (US); Krischan Eberle, Staufen (DE)

(73) Assignee: Bentley Systems, Incorporated, Exton, PA (US)

( * ) Notice: Subject to any disclaimer, the term of this patent is extended or adjusted under 35 U.S.C. 154(b) by 231 days.

(21) Appl. No.: 16/156,726

(22) Filed: Oct. 10, 2018

(51) Int. Cl.
*G06F 16/28* (2019.01)
*G06F 16/22* (2019.01)
*G06F 30/00* (2020.01)

(52) U.S. Cl.
CPC .......... *G06F 16/288* (2019.01); *G06F 16/221* (2019.01); *G06F 16/2282* (2019.01); *G06F 16/289* (2019.01); *G06F 30/00* (2020.01)

(58) Field of Classification Search
None
See application file for complete search history.

(56) References Cited

U.S. PATENT DOCUMENTS

| | | | | |
|---|---|---|---|---|
| 5,611,076 | A * | 3/1997 | Durflinger | G06F 16/258 |
| 5,659,723 | A | 8/1997 | Dimitrios et al. | |
| 6,374,256 | B1 * | 4/2002 | Ng | G06F 9/4493 |
| | | | | 707/741 |
| 6,539,398 | B1 | 3/2003 | Hannan et al. | |
| 6,591,275 | B1 * | 7/2003 | Russell | G06F 16/284 |
| | | | | 717/108 |
| 9,607,063 | B1 * | 3/2017 | Cao | G06F 16/211 |
| 10,353,916 | B2 | 7/2019 | Bentley et al. | |
| 10,437,564 | B1 * | 10/2019 | Periwal | G06F 16/84 |

(Continued)

OTHER PUBLICATIONS

U.S. Appl. No. 16/156,824, filed Oct. 10, 2018 by Ramanujam Raman et al. for Technique for Generating a Change Cache Database Utilized to Inspect Changes Made to a Repository, pp. 1-35.

*Primary Examiner* — Uyen T Le
(74) *Attorney, Agent, or Firm* — Cesari and McKenna, LLP; James A. Blanchette

(57) ABSTRACT

Techniques are provided for maintaining a class hierarchy of an object-oriented data model in tables of a relational database that minimize performance impact (e.g., in terms of both processing resources and storage footprint). In one embodiment, an object-relational mapping system accesses a class hierarchy of an object-oriented data model. A plurality of tables of a relational database are generated, including a primary table, a joined table and an overflow table. The object-relational mapping system maps classes of the class hierarchy to the primary table, joined table and overflow table, wherein the mapping maps properties of classes to columns of the primary table and joined table until a column threshold is reached and then maps excess properties to columns of the overflow table, and the mapping shares at least one column of the primary table, joined table or overflow table among classes such that multiple different properties are mapped to the shared column. The properties of the classes are stored to the plurality of tables according to the mapping.

20 Claims, 10 Drawing Sheets

(56) References Cited

U.S. PATENT DOCUMENTS

| | | | |
|---|---|---|---|
| 2005/0097187 A1* | 5/2005 | Thompson | G06F 16/252 709/217 |
| 2012/0210416 A1* | 8/2012 | Mihelich | H04L 67/1004 726/11 |
| 2014/0208063 A1* | 7/2014 | Ruggiero | G06F 12/1036 711/206 |
| 2019/0079958 A1 | 3/2019 | Bentley et al. | |
| 2019/0108245 A1 | 4/2019 | Bentley et al. | |

* cited by examiner

MAINTAINING A CLASS HIERARCHY OF AN OBJECT-ORIENTED DATA MODEL USING SHARED COLUMNS AND/OR OVERFLOW TABLES

BACKGROUND

Technical Field

The present disclosure relates generally to storing data for infrastructure modeling, and more specifically to techniques for maintaining a class hierarchy of an object-oriented data model, for use in infrastructure modeling.

Background Information

Throughout the design, construction and operation of infrastructure (e.g., buildings, factories, roads, railways, bridges, etc.) it is often desirable to model the infrastructure using infrastructure modeling applications. Such infrastructure modeling applications often use a variety of different technologies and data formats to maintain infrastructure descriptions, used in different phases of an infrastructure project. Typically, infrastructure maintained according to such formats is disjointed, and includes substantial data redundancies, inconsistencies, and other sources of inefficiency. Structures may be may be optimized and adapted for particular use cases, generally without regard for other phases of the infrastructure project, leading to distinct product/discipline/phase data silos and disconnected workflows.

There is a need for techniques that can break down such existing product/disciple/phase data silos and enable a generation of a "digital twin" of real-world infrastructure that describes infrastructure in a more unified manner. However, generation of a "digital twin" creates a number of technical challenges in how to store, access and update data efficiently. Some techniques utilize a conceptual schema that defines semantics, data structures and concepts used for modeling the infrastructure. Entities of the conceptual schema may have associated metadata such that they are self-describing. Such metadata may be defined in classes of an object-oriented data model. However it may be a challenge to store properties of such classes efficiently. Prior attempts have sometimes led to poor system performance (e.g., in terms of processing resources and/or storage footprints).

Accordingly, there is a need for improved techniques for maintaining a class hierarchy of an object-oriented data model, for use in infrastructure modeling.

SUMMARY

Techniques are provided for maintaining a class hierarchy of an object-oriented data model for use in infrastructure modeling in tables of a relational database, utilizing shared columns and/or overflow tables to improve system performance (e.g., in terms of processing resource usage and/or storage footprint consumed).

In a first embodiment, an object-relational mapping system accesses a class hierarchy of an object-oriented data model and determines a number of different properties of a largest class of the class hierarchy. One or more tables of a relational database are generated having a number of columns based on the number of different properties of the largest class. The object-relational mapping system proceeds to map classes of the class hierarchy to the one or more tables. The mapping shares at least one column of the one or more tables among the classes, such that multiple different properties are mapped to the shared column. Thereafter, properties of the classes of the class hierarchy are stored to the one or more tables according to the mapping.

In a second embodiment, an object-relational mapping system accesses a class hierarchy of an object-oriented data model, where the class hierarchy includes a base class and a plurality of subclasses. A plurality of tables of a relational database are generated, including one or more initial tables and an overflow table. The object-relational mapping system proceeds to map the base class and subclasses to the one or more initial tables and the overflow table. The mapping maps properties to columns of the one or more initial tables until a column threshold is reached, and maps excess properties to columns of the overflow table. Thereafter, properties of the classes of the class hierarchy are stored to the plurality of tables according to the mapping.

In a third embodiment, an object-relational mapping system accesses a class hierarchy of an object-oriented data model. A plurality of tables of a relational database are generated, including a primary table, a joined table and an overflow table. The object-relational mapping system maps classes of the class hierarchy to the primary table, joined table and overflow table. The mapping maps properties of classes to columns of the primary table and joined table until a column threshold is reached, and then maps excess properties to columns of the overflow table. The mapping shares at least one column of the primary table, joined table or overflow table among classes such that multiple different properties are mapped to the shared column. Thereafter, properties of the classes of the class hierarchy are stored to the plurality of tables according to the mapping.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings, of which.

DETAILED DESCRIPTION

Figure 1:
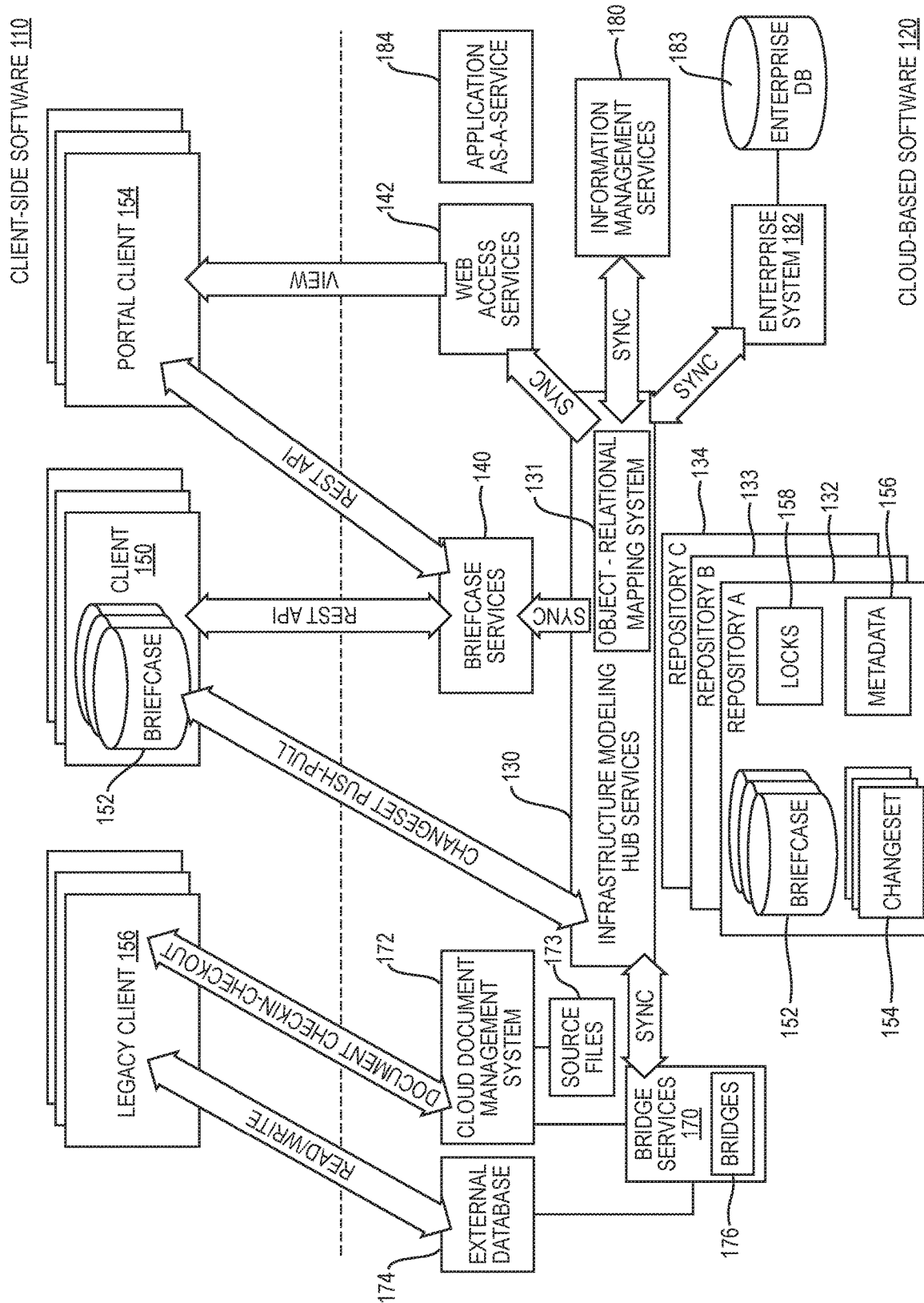
FIG. 1 is a high-level block diagram of at least a portion of an example infrastructure modeling software architecture.

FIG. 1 is a high-level block diagram of at least a portion of an example infrastructure modeling software architecture. The architecture may be divided into client-side software 110 executing on one more or more computing devices arranged locally on-premises or hosted for an enterprise's use (collectively "client devices"), and cloud-based services software 120 that is executed on one or more remote computing devices ("cloud computing devices") accessible to the enterprise, and other enterprises, over the Internet.

At the core of the cloud-based services software 120 are infrastructure modeling hub services (e.g., iModelHub services) 130 that provide centralized management and synchronization support, and that work closely with briefcase services 140 that provide clash detection, validation, costing, publishing, analytics, among other services. Infrastructure modeling hub services (e.g., iModelHub services) 130 maintain repositories 132-134 that include briefcases 152, a set of accepted changesets (e.g., historical changesets) 154, metadata 156 (e.g., that includes storage locations, lookup identifiers, sequence information, etc. about the changesets), and locks 158 (e.g., that may provide pessimistic locking per element and per model). In this context, a "repository" refers to a distributed database (e.g., a distributed SQLite database), a "briefcase" refers to a particular instance of a database (e.g., a SQLite database), and a "changeset" refers to a persistent electronic artifact that captures changes needed to transform a particular briefcase from one valid state to a new valid state A briefcase 152 in a repository 132-134 may begin as an empty "baseline" briefcase that is programmatically generated and persisted by infrastructure modeling hub services (e.g., iModelHub services) 130. At least some of the tables of the briefcase may be constructed based upon mappings managed by an object-relational mapping system (e.g., ECDb) 131. A repository 132-134 may be modified by accepting new changesets into the sets of accepted changesets 154. A changeset may be created by change-detection functionality that records the actual and specific effects of modifications made to a briefcase. A new changeset may only be accepted as a modification of the repository (i.e. into the set of accepted changesets 154) if it holds changes relative to a briefcase that is of the most recent version of the repository's information. As the number of changesets in the sets of accepted changesets 154 grows, the time required to take an empty "baseline" briefcase and apply all changesets needed to transform it into a briefcase at a specific version (e.g., the "most recent version") may grow large. For this reason, infrastructure modeling hub services (e.g., iModelHub services) 130 may create additional "snapshot" briefcase 152 at different versions. When a specific version (e.g., the "most recent version") of a briefcase is needed, the briefcase 152 closest to such version (which may be a "snapshot" briefcase) is accessed and changesets (or reverse changesets) from the set 154 are applied until a briefcase 152 of the needed version is obtained.

Clients 150 may be executed locally on desktop or mobile computing devices of an enterprise or hosted for the enterprise's use. Each client 150 may utilize a Hypertext Transfer Protocol (HTTP)-based representational state transfer (REST) application program interface (API) to communicate with the briefcase services 140 and infrastructure modeling hub services (e.g., iModelHub services) 130 to obtain a local copy of a briefcase and changesets needed to transform it into a briefcase of a desired version of the repository 132-134. Clients 150 may subscribe to notification functions provided by infrastructure modeling hub services (e.g., iModelHub services) 130 to receive notifications regarding new changesets in the repository's set of accepted changesets 154. The clients 150 may then "pull" (download) the new changeset(s) and apply them to a briefcase to update it to the new version. Similar operations may occur when a client 150 modifies a briefcase, to propagate those changes. When a client modifies a version of a briefcase (e.g., version X), resulting in a modified briefcase with a provisional new version number (e.g., a provisional new version Y), a new provisional changeset (e.g., a provisional changeset Y) is generated from the modifications. The provisional changeset Y is then "pushed" (uploaded) to modeling hub services (e.g., iModelHub services) 130. If version X is still the version of the most recent changeset that has been accepted into the repository's set of accepted changesets 154, then the provisional changeset Y is accepted into the set of accepted changesets 154 and becomes the new "most recent changeset" Otherwise, the client 152 may "pull" (download) any newer changeset(s) and apply them to its briefcase and reconcile any inconsistencies created by that update. After this "pull and merge" process is complete, the client 152 may attempt to "push" (uploaded) an updated provisional changeset to infrastructure modeling hub services (e.g., iModelHub services) 130.

In addition to this operation, infrastructure modeling hub services (e.g., iModelHub services) 130 may interact with other services to support additional functions. For example, infrastructure modeling hub services (e.g., iModelHub services) 130 may interact with web access services 142 that provides live or published views of infrastructure maintained in a briefcase 152 to certain practitioner applications operating as portal clients 154. Portal clients 154 may be web based, executed locally on desktop or mobile computing devices or hosted, communicating with the briefcase services 140 and infrastructure modeling hub services (e.g., iModelHub services) 130 via a HTTP-based REST API. Such portal clients 154 generally do not maintain a local briefcase, but instead rely upon connectivity to the cloud-based services software 120.

The infrastructure modeling hub services (e.g., iModelHub services) 130 may further interact with a number of cloud-based services that perform information management and support functions. Information services 180 manage asset data, project data, reality data, Internet of Things (IoT) data, codes, and other features. An enterprise system 182 manages an on-site or hosted enterprise database 183 storing enterprise-specific data. Further, an application-as-a-service platform 184 provides insights, deliverables management, package management, as well as a variety of other services.

Certain external applications (referred to generally as "legacy clients") 156 may rely on different technologies and data formats to maintain infrastructure descriptions. Such formats may include a number of long-utilized database and file formats, such as DGN, DWG, RVT, IFC, etc. Legacy clients 156 may make changes to data by checking-out, modifying, and then checking-back-in files 173 with a document management system 172, or reading and then writing-back different database entries to an external debase 174. To support such legacy clients 156, the bridge services 170 may work together with infrastructure modeling infrastructure modeling hub services (e.g., iModelHub services) 130 to incrementally align data in source files 173 managed by the document management system 172 and/or in the external database 174 from the source formats to be compatible. To that end, that bridge services 170 include a number of source-format-specific bridge software processes 176 that each know how to read and interpret source data of a respective source format.

A conceptual schema (e.g., BIS) may cover all aspects of infrastructure in various phases of a project (e.g., from design, to construction and operation) in a unified manner. The conceptual schema defines semantics, data structures and concepts used for modeling the infrastructure enabling production of a "digital twin" of infrastructure that operates as a cohesive whole, while avoiding unwanted data redundancies (i.e. overlapping information). Physical information may serve as a "backbone" of the "digital twin", and non-physical information (e.g., analytical information, functional information, informational information etc.) may be maintained relative to (e.g., augmenting) the "backbone." A wide variety of different modeling, analysis and visualization software programs may be able to read and understand data maintained according to the conceptual schema and create new data according to it. As such, the conceptual schema may address problems related to combining and interpreting data written using various vendor-specific, discipline-specific or industry-specific technologies and data formats, breaking down walls between what traditionally have been separate data "silos."

The functional building blocks of the conceptual schema (e.g., BIS) may be classes for the entities of elements, models, element aspects and relationships. An element is the finest-grained record that can be individually identified representing (i.e. "modeling", in a colloquial sense of the term) an entity in the real-world.

A model is a container for a set of elements where the set of elements collectively represent (i.e. "model", in a colloquial sense of the term) an entity in the real-world. The model owns the elements that it contains and provides context for the elements. Each element is contained in a single model. Every model represents (i.e. "models", in a colloquial sense of the term) some element (that is not contained in that model), with the exception of a repository model, that operates similar to a table of contents. Models may be arranged according to a model hierarchy to support modeling from multiple perspectives. A single repository model may serve as a root of the model hierarchy.

A relationship is a connection that relates two or more elements, element aspects or models. Examples of relationships include parent-child relationships that imply ownership and peer-to-peer relationships that define groups or interconnections. In one embodiment, two types of relationships may be provided, with an abstract relationship prohibiting instantiations but permitting inheritance therefrom, and a sealed relationships prohibiting inheritance.

An element aspect describes a set of properties that belong to a particular element, but that may have an independent lifecycle (e.g., may come and go over the lifetime of an element). An element aspect is typically not individually identifiable and lacks incoming relationships other than from the element that owns it.

Figure 2:
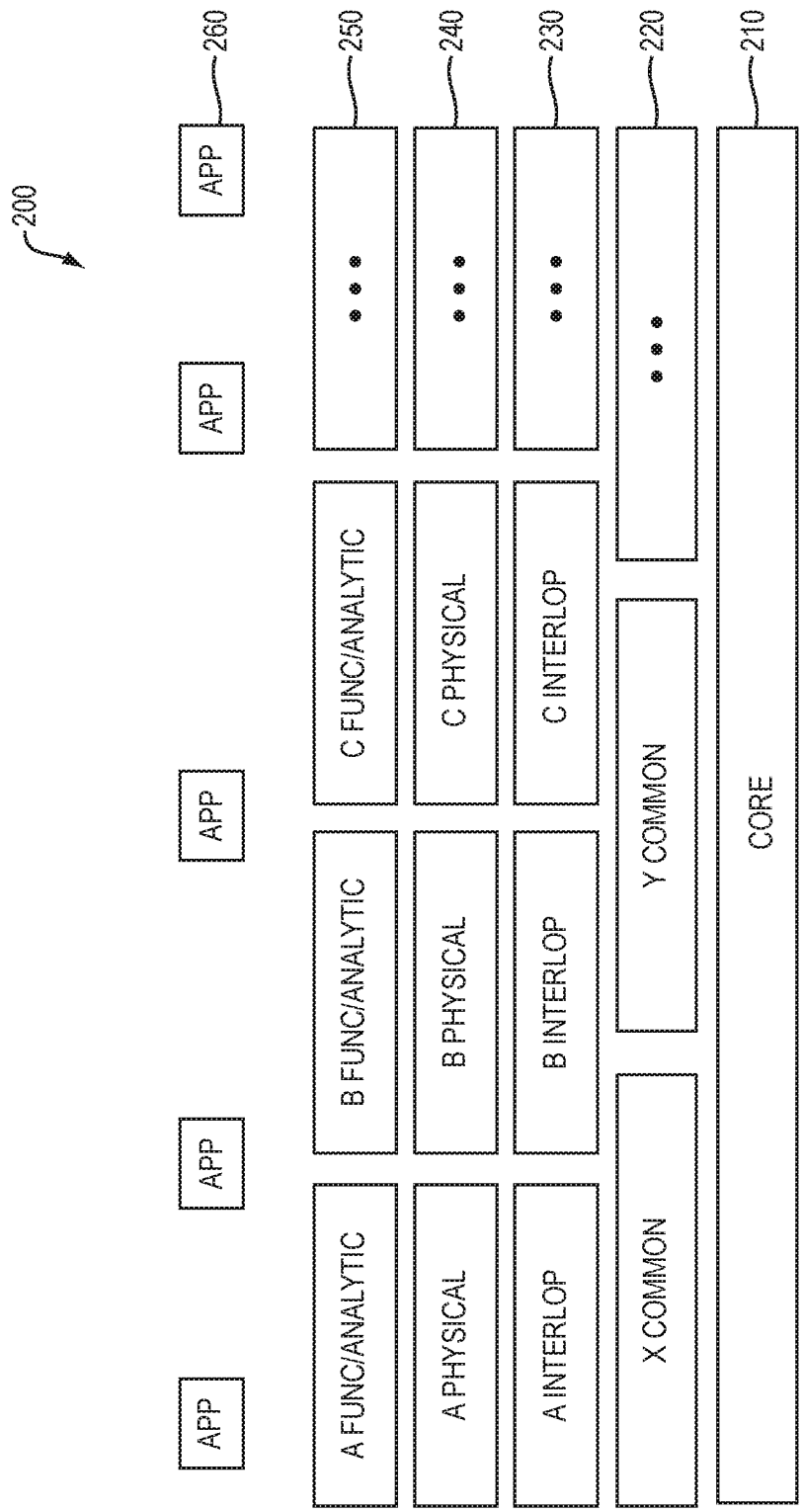
FIG. 2 is a block diagram illustrating an example of hierarchically layered domains.

The conceptual schema (e.g., BIS) supports a family of hierarchically layered domains that operate as object-oriented data models. Each domain defines a naturally coherent and limited set of subject matter, which may have a clear scope and owner. The domains may be hierarchically layered based on how generic or specialized the subject matter is. FIG. 2 is a block diagram 200 illustrating an example of hierarchically layered domains. At the lowest layer (e.g., a "BisCore" layer), a single core domain may define core classes and organizational strategies that all other domains must follow. Entities such as model and element are in this lowest layer. At a next layer above the core layer (e.g., a "common" layer) 220, common domains may define data types and organizational strategies applicable to multiple engineering disciplines. An example of a common domain may be a "Building" common domain that includes classes and organizational strategies related to building qualities such as stories, but not lower level details of architecture (such as windows) or structure (such as beams). At a further layer above the common layer (e.g., an "interoperability" layer) 230, interoperability domains may define data types and organizational strategies applicable to interoperability among engineering disciplines. An example interoperability domain may describe electrical concepts, such as load, that may allow other disciplines to define required electrical service (e.g., for pumps, elevators, server rooms, etc.). At a still further layer above the interop layer (e.g., a "physical" layer) 240, physical domains may define data types and organizational strategies applicable to real-world physical entities. At yet an even higher layer above the physical layer (a "functional/analytical" layer) 250, functional/analytical domains may define data types and organizational strategies for functional or analytical concepts used to enable schematics and simulations. At a final layer above the functional/analytical layer e.g., (an "application" layer 260), small application domains may define a limited number of data types for access by specific application software.

Entities of the conceptual schema (e.g., BIS) may be defined by a classification system (e.g., an Entity Classification (EC) system). It provides standard metadata that allows clients 150 to understand information about entities, applying appropriate labels, engineering units, etc. The classification system may utilize classes (e.g., ECClasses) the include properties (e.g., ECProperties) that are defined by a schema file (e.g., an ECSchema). Different types of classes may support inheritance within their own class type. For example, one class (e.g., ECEntityClass) may model business information related to entities, another class (e.g., ECStructClass) may model complex property types, such as structs for entities, and still another class (e.g., ECCustomAttributeClass) may model information which is applied to entities in order to provide additional metadata. A special class (e.g., ECRelationshipClass) describes relationships (i.e. connections) between entities. Different type of properties (e.g., ECProperties) represent different types of named values within a class. For example, one type of property (e.g., ECProperty) represents properties with a limited set of primitive value types, another type of property (e.g., ECStructProperty) represents complex properties (structs), another type of property (e.g., ECArrayProperty) represents an array of primitive values, still another type (e.g., ECStructArrayProperty) represents an array of struct values. A special type of property (e.g., ECNavigationProperty) is only allowed in a certain class (e.g., ECEntityClass) and represents a reference to an instance of another class (e.g., ECEntityClass). A property type may have a base property determined from a base class. A derived property may inherit attributes from its base property, which maybe overridden by custom attributes.

The schema file (e.g., ECSchema) describes how classes (e.g., ECClasses) and their properties (e.g., ECProperties)

should be mapped to columns of tables (e.g., SQLite tables) of a briefcase 152. Each class (e.g., ECClass) is assigned to one or more tables where its properties are stored. Each property (e.g., ECProperty) of a given class (e.g., ECClass) is mapped to a column that stores its value. The mapping may be performed by the object-relational mapping system (e.g., ECDb) 131 that interprets the schema file (e.g., ECSchema) and maps the classes (e.g., ECClasses) and their properties (e.g., ECProperties) into tables (e.g., SQLite tables) that, for example, lack object-oriented inheritance support.

The object-relational mapping system (e.g., ECDb) 131 may support a number of mapping rules that define how classes (e.g., ECClasses) and their properties (e.g., ECProperties) should be mapped to tables. The mapping rule used for a given class (e.g., ECClass) may be specified in its schema file (e.g., ECSchema). Mapping rules may incudes rules that map a class to its own table, map a class to an existing table being used by other classes, exclude a class from being mapped to any table, and map a class and all of its subclasses to a table, among other possibilities. For the special case of relationships (e.g., ECRelationshipClass), special rules may be provided to map an identifier of a related object to a foreign key column of a child table, and to map pairs of identifiers of related objects to a separate table (e.g., a link table).

Figure 3A:
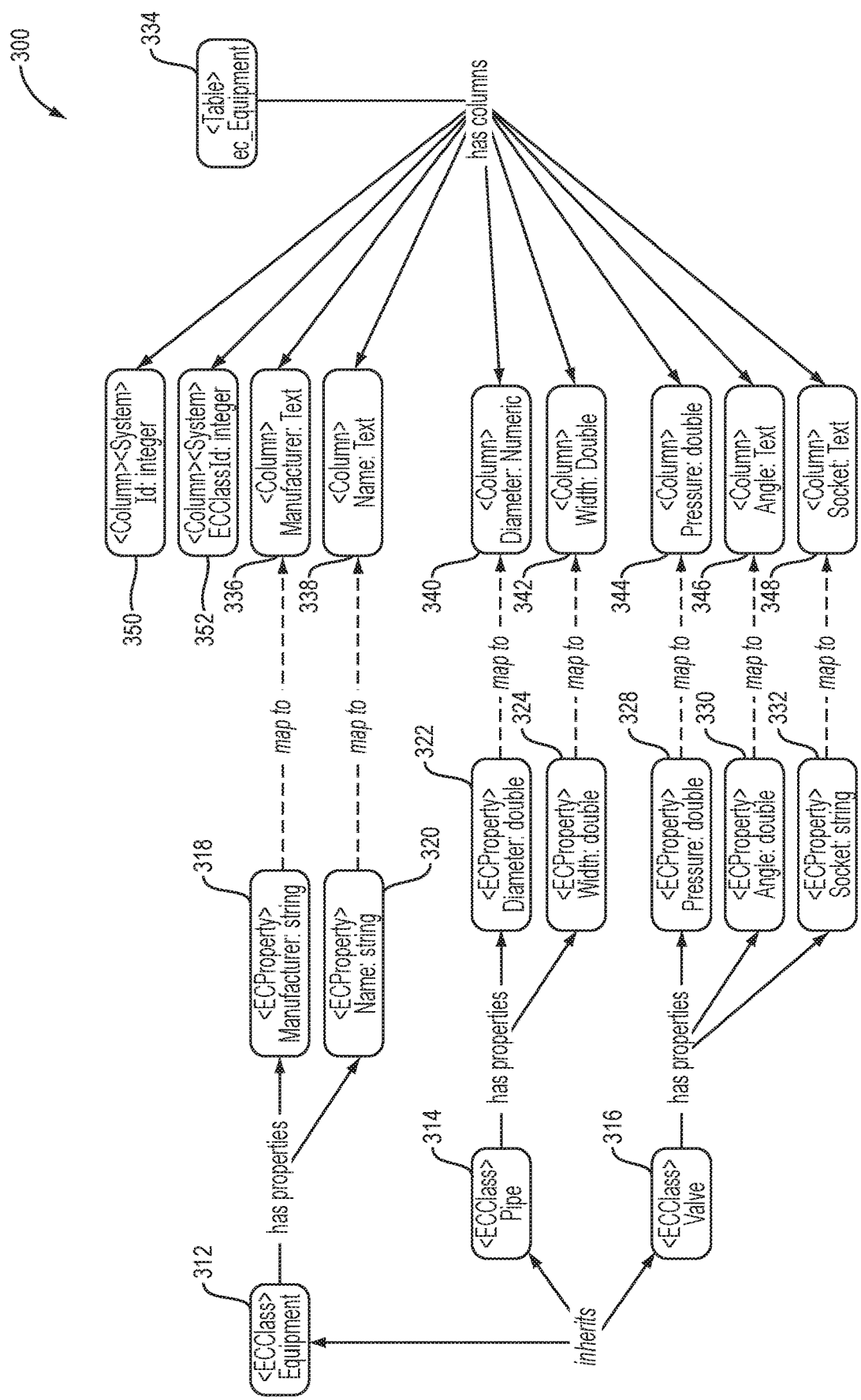
FIG. 3A is an example mapping of a class hierarchy (e.g., an ECClass hierarchy) (including a base class and its subclasses) to tables (e.g., SQLite tables)

Of these rules, mapping a class and all of its subclasses to a table may be the most utilized. FIG. 3A is an example mapping 300 of a class hierarchy (e.g., an ECClass hierarchy) (including a base class and its subclasses) to tables (e.g., SQLite tables). In this example a base class "Equipment" 312 has properties of "Manufacturer" 318 and "Name" 320. Subclasses of the "Equipment" class 312 include a subclass "Pipe" 314 that has properties of "Diameter" 322 and "Width" 324 and a subclass "Valve" 316 that has properties of "Pressure" 328 and "Angle" 330, and a property of "Socket" 332. By applying the mapping rule, the object-relational mapping system (e.g., ECDb) 131 maps the base class "Equipment" 312 and its subclasses "Pipe" 314 and "Valve" 316 to a table "ec_Equipment" 334 that has columns 336-348, which correspond to each of the properties 318-332. An additional "Id" column 350 stores a unique instance identifier for the class "Equipment" 312 and an "ecClassId" column 352 stores class type information.

Figure 3B:
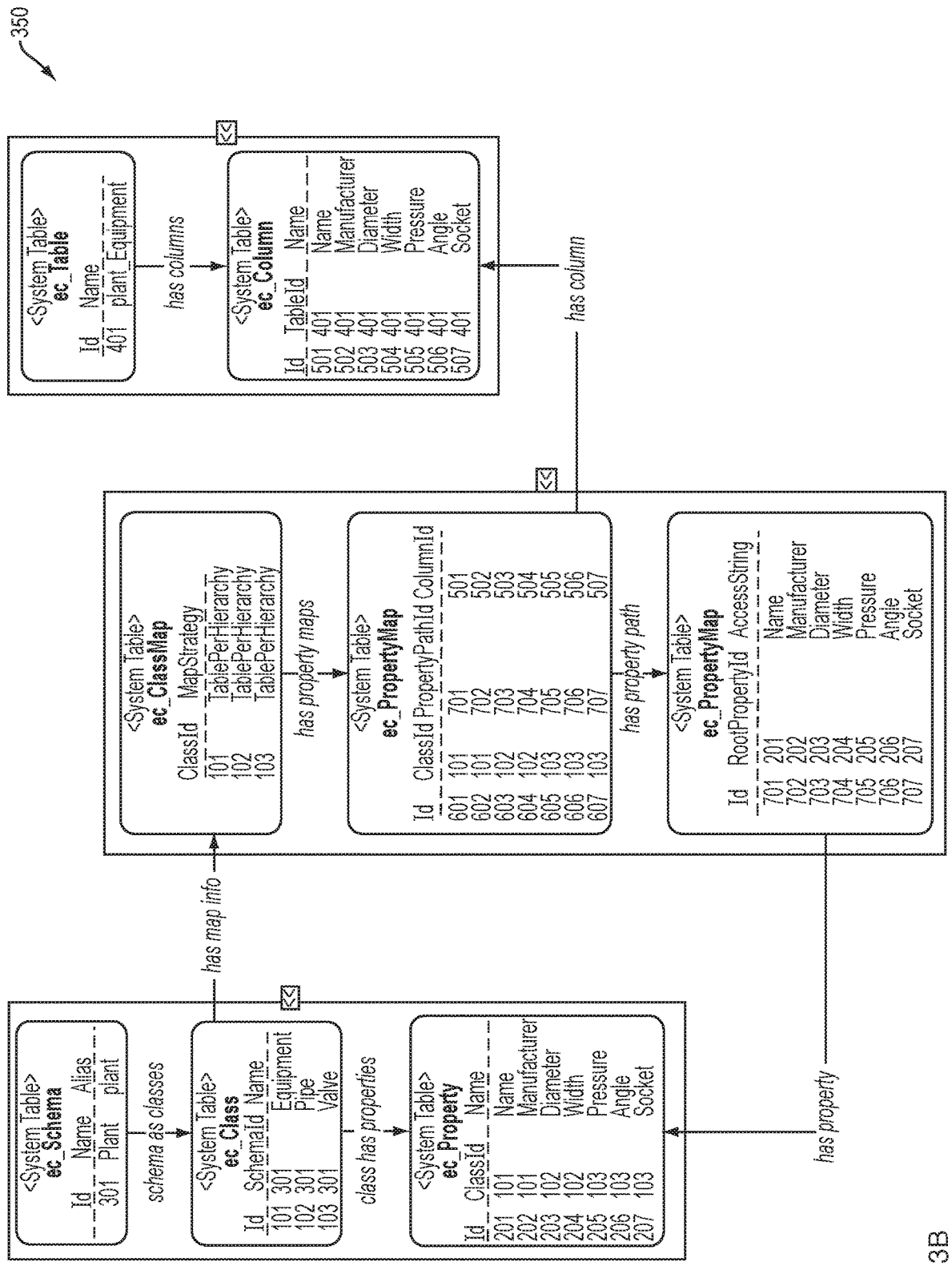
FIG. 3B is an illustration of how the mapping shown in FIG. 3A may be specified in a schema file (e.g., an ECSchema)

FIG. 3B is an illustration 350 of how the mapping shown in FIG. 3A may be specified in a schema file (e.g., an ECSchema). The schema file (e.g., an ECSchema) may be loaded by the object-relational mapping system (e.g., ECDb) 131 and used to perform the mapping when properties from the base class 312 and subclasses 314, 316 are to be stored or accessed from the tables (e.g., SQLite tables).

Since the mapping of a class and all of its subclasses to a table may be the most utilized mapping, how the mapping is performed may have the largest impact on database performance (e.g., in terms of both utilization of processing resources and storage footprint consumed). In addition to the above discussed lack of object-oriented inheritance support, there may be a number of database structure criteria that greatly impact performance. For example, performance may be impacted by the number of columns in a table and thereby there may be benefits to minimizing the number of columns in a given table. Performance may be heavily degraded if a number of columns exceeds a certain column threshold. For example, in the case of a SQLite database, use of more than 63 columns may heavily degrade performance. Accordingly, there may be incentives to ensure a column threshold is not exceeded.

One approach to addressing these performance issues (referred to as the "joined table" approach) involves splitting properties (e.g., ECProperties) of a class hierarchy (e.g., an ECClass hierarchy) across two tables. A primary table holds the properties of all the classes (e.g., ECClasses) until a specified point in the class hierarchy that serves as a splitting point. The properties of subclasses after the splitting point are mapped to a second table (i.e., a joined table). There may be multiple joined tables corresponding to different subclasses or subclass sub-hierarchies.

Figure 4A:
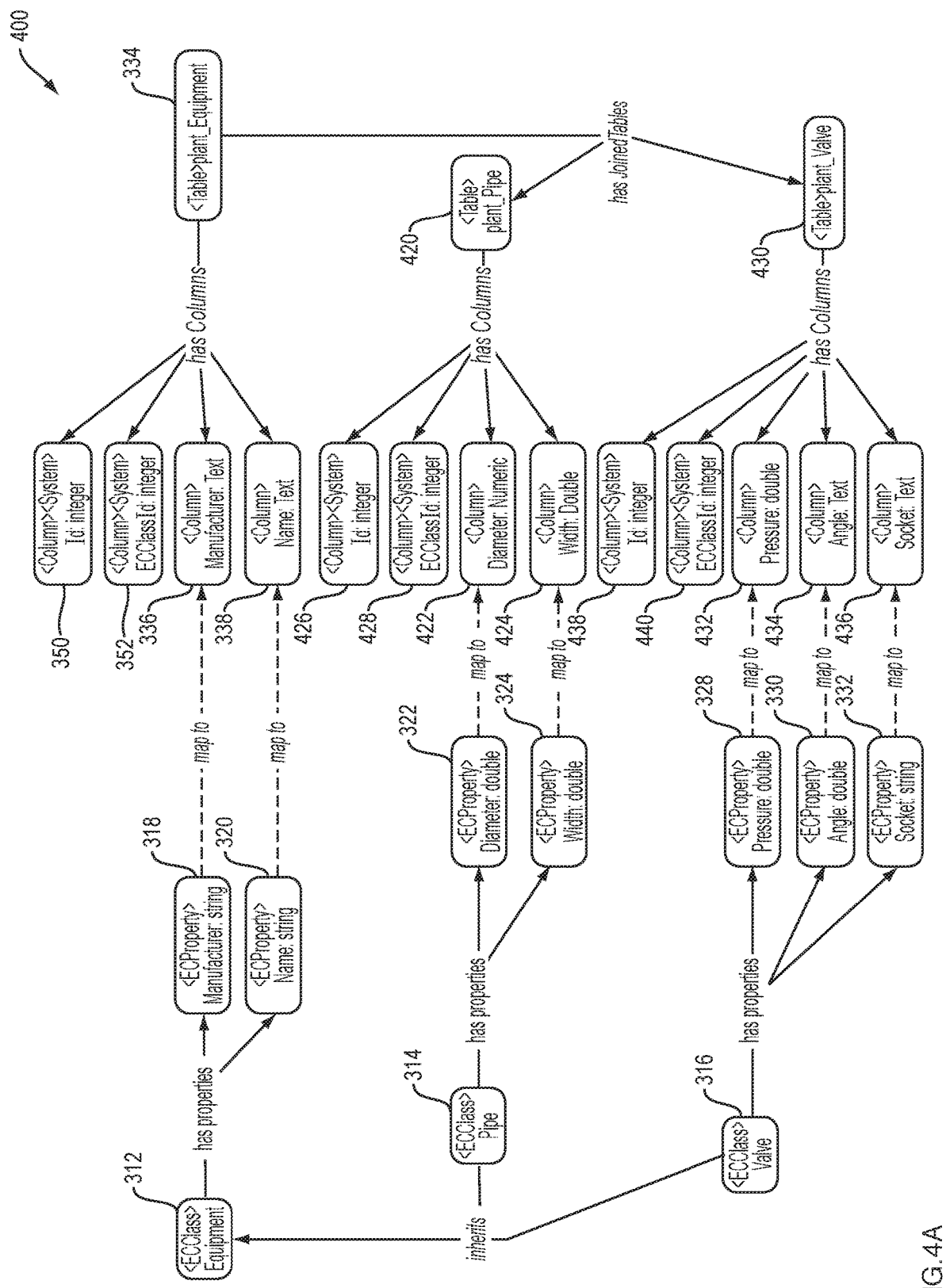
FIG. 4A is an example mapping of a class hierarchy (e.g., an ECClass hierarchy) (including a base class and its subclasses) using a joined table approach to tables (e.g., SQLite tables)

FIG. 4A is an example mapping 400 of a class hierarchy (e.g., an ECClass hierarchy) (including a base class and its subclasses) using a joined table approach to tables (e.g., SQLite tables). As in FIG. 3A, a base class "Equipment" 312 has properties of "Manufacturer" 318 and "Name" 320. Subclasses of the "Equipment" class 312 include a subclass "Pipe" 314 that has properties of "Diameter" 322 and "Width" 324, and a subclass "Valve" 316 that has properties of "Pressure" 328 and "Angle" 330, and a property of "Socket" 332. A splitting point may be defined between the class "Equipment" 312 and the subclasses "Pipe" 314 and "Valve" 316. By applying the mapping rule, the object-relational mapping system (e.g., ECDb) 131 maps the base class "Equipment" 312 to a primary table "plant_Equipment" 334 that has a "Manufacturer" column 336 and a "Name" column 338 that store the respective properties 318, 320. An additional "Id" column 350 stores a unique instance identifier for the class "Equipment" 312 and an "ecClassId" column 352 stores class type information. The object-relational mapping system (e.g., ECDb) 131 maps the subclass "Pipe" 314 to a joined table "plant_Pipe" 420 that has a "Diameter" column 422 and a "Width" column 424 that stores the respective properties 322, 324. An additional "Id" column 426 stores a unique instance identifier for the class "Pipe" 314 and an "ecClassId" column 428 stores class type information. Likewise, the object-relational mapping system (e.g., ECDb) 131 maps the subclass "Valve" 316 to a joined table "plant_Valve" 430 that has a "Pressure" column 432, an "Angle" column 434, and a "Socket" column 436 hat store the respective properties 328, 330, 332. An additional "Id" column 438 stores a unique instance identifier for the class "Valve" 316 and an "ecClassId" column 440 stores class type information.

Figure 4B:
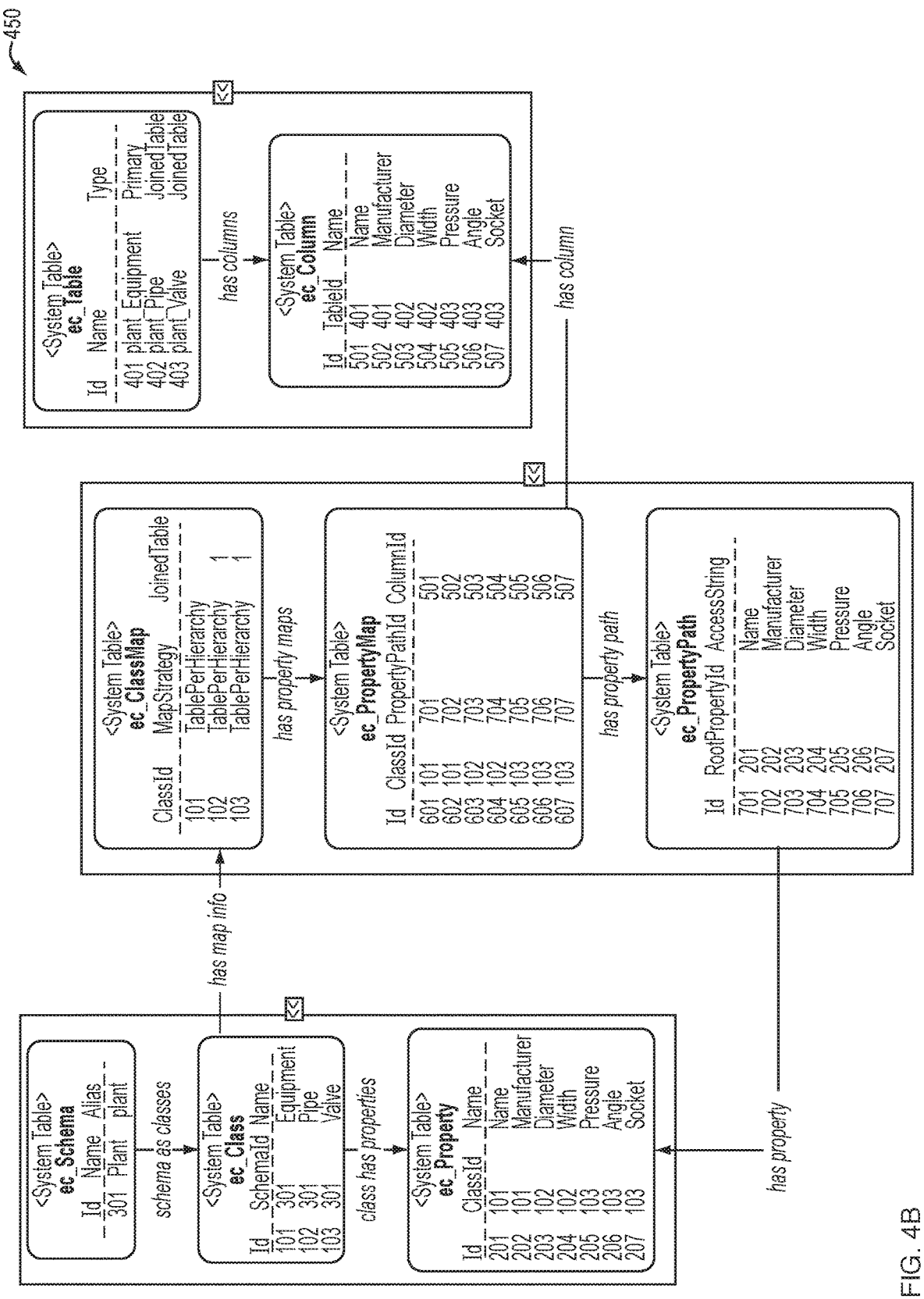
FIG. 4B is an illustration of how the mapping shown in FIG. 4A may be specified in a schema file (e.g., an ECSchema)

FIG. 4B is an illustration 450 of how the mapping shown in FIG. 4A may be specified in a schema file (e.g., an ECSchema). The schema file (e.g., an ECSchema) may be loaded by the object-relational mapping system and used to perform the mapping when properties from the base class 312 and subclasses 314, 316 are to be stored or accessed from the tables (e.g., SQLite tables).

While use of a joined table approach may improve performance (e.g., in terms of both processing resources and storage footprint) and reduce potential violations of the above discussed database structure criteria that may degrade performance, it may not fully eliminate performance issues. For example, while the approach alone may often be used to produce tables that have fewer columns than a column threshold (e.g., fewer than 63 columns), when classes (e.g., ECClasses) of a hierarchy collectively have more than 126 different properties (e.g., ECProperties) the approach alone may still result in tables with more columns than the column threshold, and thereby severe performance impacts due to violation of the database structure criteria.

To address this issue, an additional approach (referred to as the "shared column" approach) may be used that involves allowing classes (e.g., ECClasses) mapped to a same table to share database columns, such that multiple different properties (e.g., ECProperties) are stored in the same column, taking advantage of flexible data type handling. This approach allows for optimizing column usage by avoiding columns with mostly empty rows. Instead, different properties (e.g., ECProperties) having different data types may be packed together in the same column. The number of required columns is thereby based upon the number of different properties (e.g., ECProperties) of the largest class (e.g., ECClasses) of the hierarchy, rather than the number of different properties (e.g., ECProperties) among all classes of the hierarchy.

Figure 5A:
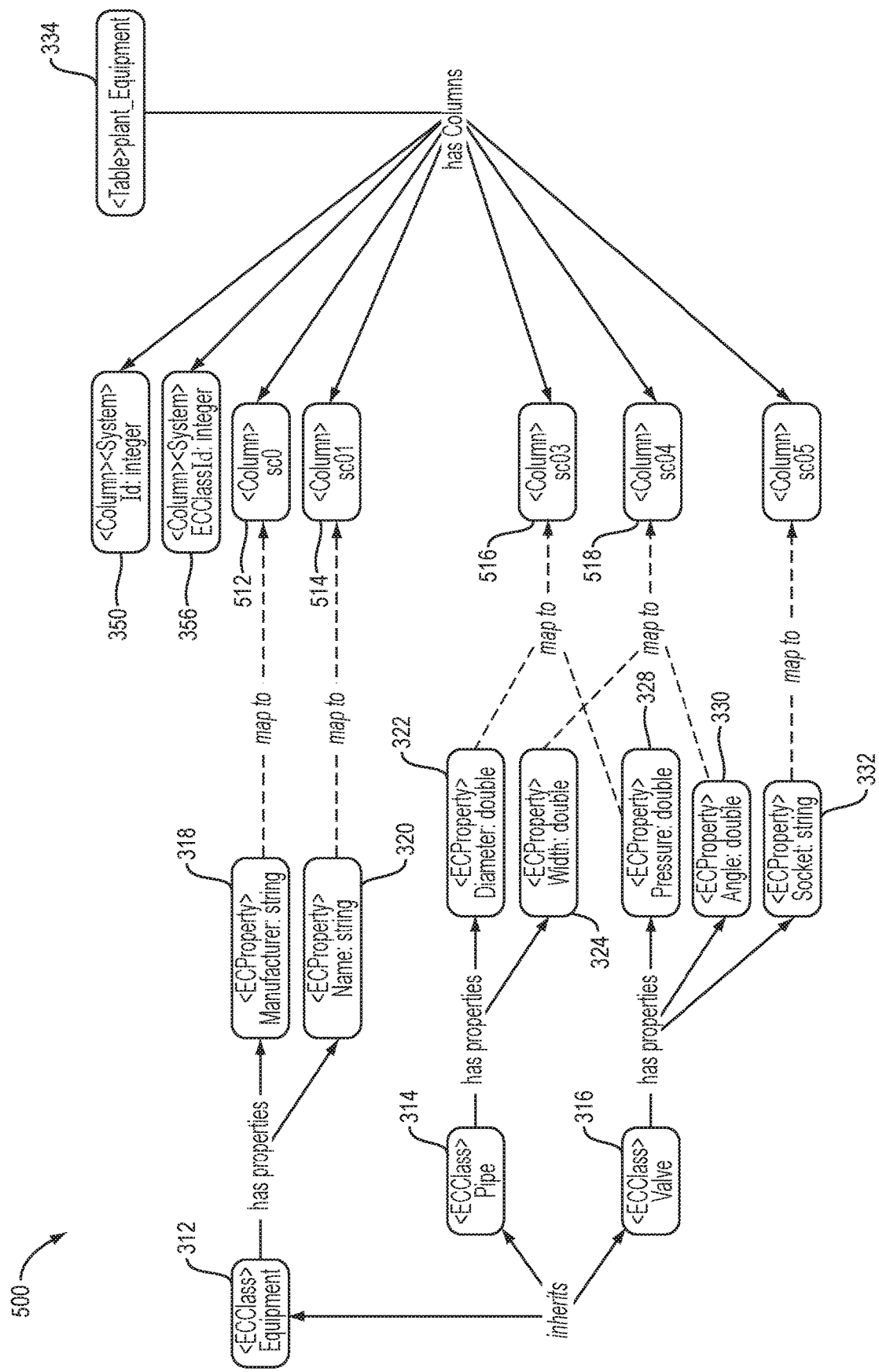
FIG. 5A is an example mapping of a class hierarchy (e.g., an ECClass hierarchy) (including a base class and its subclasses) using a shared column approach to tables (e.g., SQLite tables)

FIG. 5A is an example mapping 500 of a class hierarchy (e.g., an ECClass hierarchy) (including a base class and its subclasses) using a shared column approach to tables (e.g., SQLite tables) stored in a briefcase 152 or repository 132-134. As in FIG. 3A, a base class "Equipment" 312 has properties of "Manufacturer" 318 and "Name" 320. Subclasses of the "Equipment" class 312 include a subclass "Pipe" 314 that has properties of "Diameter" 322 and "Width" 324 and a subclass "Valve" 316 that has properties of "Pressure" 328 and "Angle" 330 and a property of "Socket" 332. By applying the mapping rule, the object-relational mapping system (e.g., ECDb) 131 maps the base class "Equipment" 312 to a table "plant_Equipment" 334 that has an "sc0" column 512 and a "sc01" column 514 that store the respective properties 318, 320. An additional "Id" column 350 stores a unique instance identifier for the class "Equipment" 512 and an "ecClassId" column 352 stores class type information. So far, this is similar to the approach in FIG. 3A, other than the generic column names. However, at least some properties (e.g., ECProperties) may be packed together into the same shared column. For instance, the object-relational mapping system (e.g., ECDb) 131 maps both the properties of "Diameter" 322 from the subclass "Pipe" 314 and "Pressure" 328 from the subclass "Valve" 316 to the same "sc03" column 516. Likewise, the object-relational mapping system (e.g., ECDb) 131 maps the properties of "Width" 334 from the subclass "Pipe" 314 and "Angle" 330 from the subclass "Valve" 316 to the same "sc04" column 518. As can be seen, these columns are being shared. The property of "Socket" 332 may be mapped to its own "sc05" column 520.

Figure 5B:
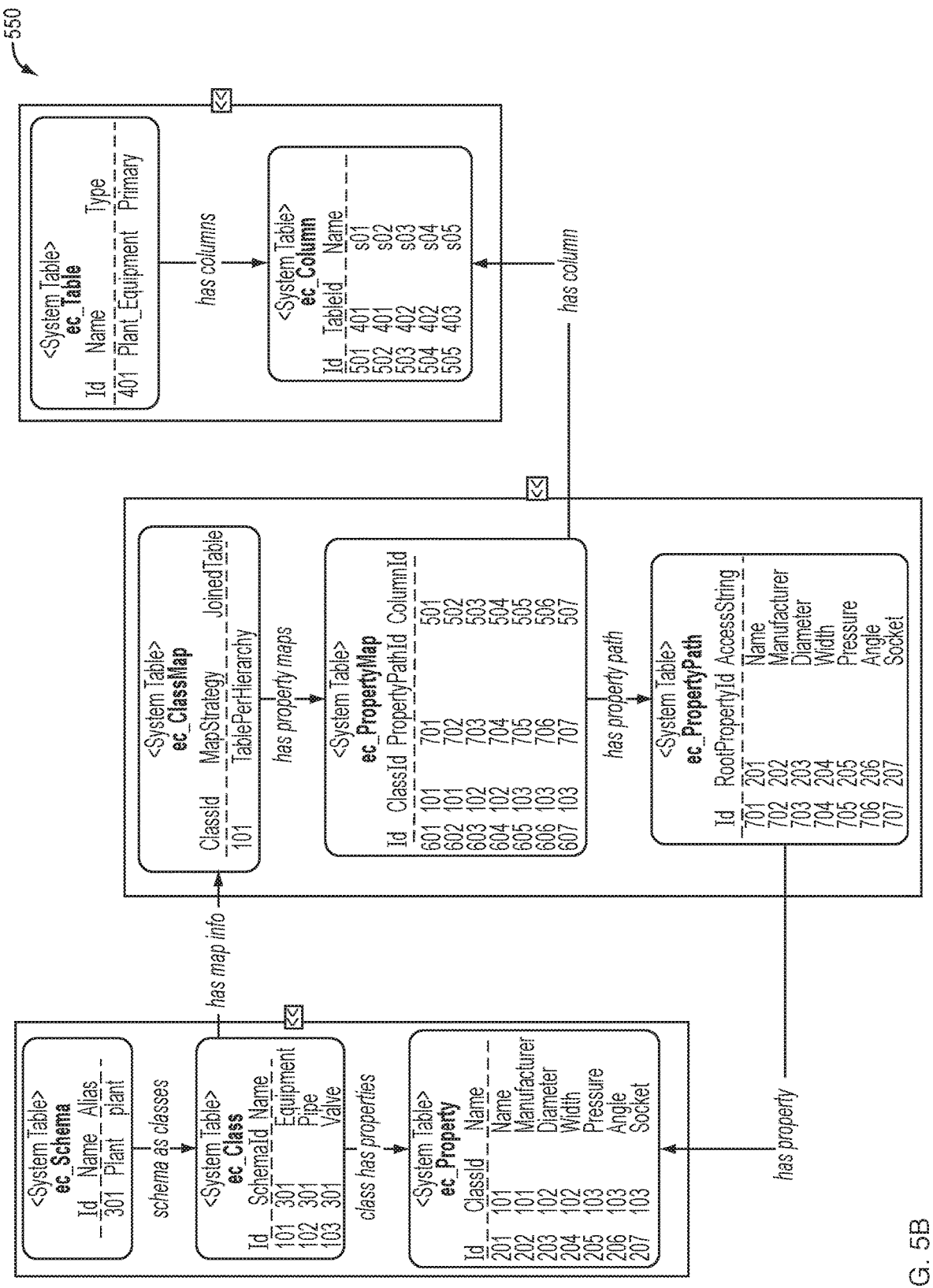
FIG. 5B is an illustration of how the mapping shown in FIG. 5A may be specified in a schema file (e.g., an ECSchema)

FIG. 5B is an illustration 550 of how the mapping shown in FIG. 5A may be specified in a schema file (e.g., an ECSchema). The schema file (e.g., an ECSchema) may be loaded by the object-relational mapping system and used to perform the mapping when properties from the base class 312 and subclasses 314, 316 are to be stored or accessed from the tables (e.g., SQLite tables).

While a shared column approach may offer significant performance benefits, there are situations where it is still insufficient to produce tables that have fewer columns than a column threshold (e.g., fewer than 63 columns). For example, a single class may have a large number of properties. To address this issue, an additional approach (referred to as the "overflow table" approach) may be used that involves mapping excess properties beyond a column threshold (e.g., ECProperties beyond those accommodated in the primary table and joined table) to a third table (i.e. an overflow table). The overflow table may be allowed to exceed database structure criteria, such as the column threshold (e.g., 63 columns). Because its usage may be statistically rare (e.g., the vast majority of classes may not have excess properties beyond those accommodated in the primary table and joined table) on the aggregate performance impact may be minimal. Further, even when used for a class, a majority of queries for the class may not hit the overflow table, and thereby will not incur high processing requirements, provided most frequently needed information is stored in the primary table and joined table.

Figure 6A:
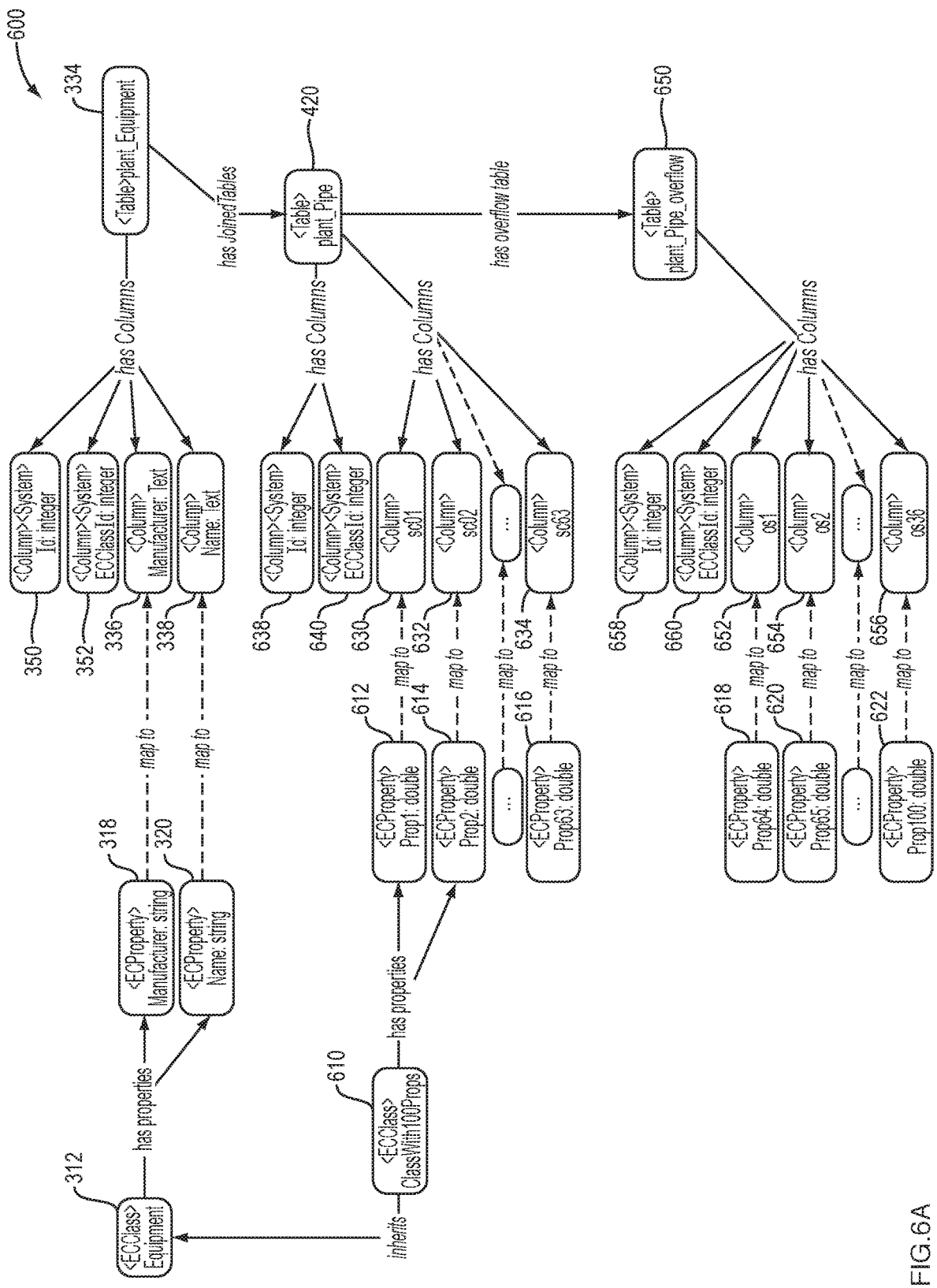
FIG. 6A is an example mapping of a class hierarchy (e.g., an ECClass hierarchy) (including a base class and its subclasses) using an overflow table approach to tables (e.g., SQLite tables)

FIG. 6A is an example mapping 600 of a class hierarchy (e.g., an ECClass hierarchy) (including a base class and its subclasses) using an overflow table approach to tables (e.g., SQLite tables). A base class "Equipment" 312 has properties of "Manufacturer" 318 and "Name" 320. Subclasses of the "Equipment" class 312 include a subclass "ClassWith100Props" 610 that has properties of "Prop1" through "Prop100" 612-622. By applying the mapping rule, the object-relational mapping system (e.g., ECDb) 131 maps the base class "Equipment" 312 to a primary table "plant_Equipment" 334 that has a "Manufacturer" column 336 and a "Name" column 338 that store the respective properties 318, 320. An additional "Id" column 350 stores a unique instance identifier for the class "Equipment" 312 and an "ecClassId" column 352 stores class type information. The object-relational mapping system (e.g., ECDb) 131 maps the subclass "ClassWith100Props" 610 to a joined table "plant_Pipe" 420 that has columns "sc01" through "sc63" 630-634 that store the respective properties 612-616. An additional "Id" column 638 stores a unique instance identifier for the subclass "ClassWith100Props" 610 and an "ecClassId" column 640 stores class type information. The object-relational mapping system (e.g., ECDb) maps subclass additional properties of the subclass "ClassWith100Props" 610, beyond those accommodated in "plant_Pipe" table 420, to an overflow table "plant_Pipe_overflow" 650 that has columns "oc01" through "oc36" 652-656 that store the respective properties 618-622. An additional "Id" column 658 stores a unique instance identifier for the subclass "ClassWith100Props" 610 and an "ecClassId" column 660 stores class type information.

Figure 6B:
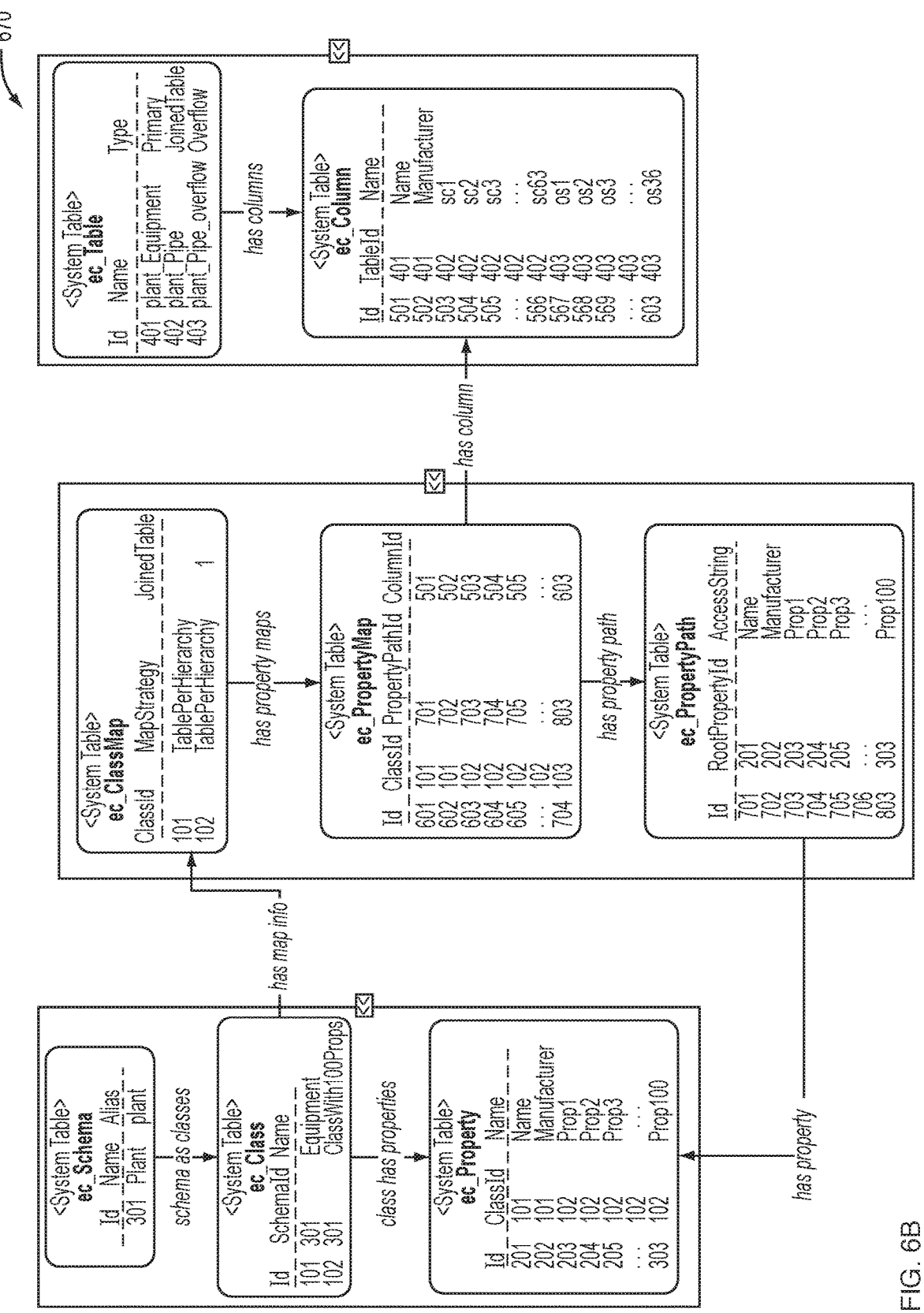
FIG. 6B is an illustration of how the mapping shown in FIG. 6A may be specified in a schema file (e.g., an ECSchema).

FIG. 6B is an illustration 670 of how the mapping shown in FIG. 6A may be specified in a schema file (e.g., an ECSchema). The schema file (e.g., an ECSchema) may be loaded by the object-relational mapping system and used to perform the mapping when properties from the base class 312 and subclass 610 are to be stored or accessed from the tables (e.g., SQLite tables).

In summary, techniques are provided for maintaining a class hierarchy of an object-oriented data model for use in infrastructure modeling in tables of a relational database, utilizing shared columns and/or overflow tables to improve system performance. It should be understood that a wide variety of adaptations and modifications may be made to the techniques. Further, in general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method of maintaining a class hierarchy of an object-oriented data model in tables of a relational database, comprising:

accessing, by an object-relational mapping system executing on an electronic device, the class hierarchy of the object-oriented data model;

determining, by the object-relational mapping system, a number of different properties of a class that has a largest number of different properties of classes of the class hierarchy;

generating one or more tables of the relational database on a storage device having a number of columns based on the number of different properties of the class;

mapping, by the object-relational mapping system, the classes of the class hierarchy to the one or more tables of the relational database, wherein the mapping shares at least one column of the one or more tables among the classes such that multiple different properties are mapped to the shared column; and storing properties of the classes of the class hierarchy to the one or more tables of the relational database according to the mapping.

2. The method of claim 1, wherein the multiple different properties mapped to the shared column include properties having different data types.

3. The method of claim 1, wherein the object-oriented data model maintains metadata that defines entities of a conceptual schema that models infrastructure.

4. The method of claim 1, wherein classes of the class hierarchy include a base class and a plurality of subclasses.

5. The method of claim 4, wherein the one or more tables comprise a primary table and a joined table, and the mapping maps the base class and subclasses to the primary table until a splitting point in the class hierarchy and maps the subclasses after the splitting point in the class hierarchy to the joined table.

6. The method of claim 5, wherein the one or more tables further comprise an overflow table, and the mapping maps properties to columns of the primary table and joined table, and where a column threshold is reached in the primary table and joined table then maps excess properties to columns of the overflow table.

7. The method of claim 6, wherein the overflow table has a number of columns that exceeds the column threshold.

8. The method of claim 7, wherein the column threshold is 63 columns.

9. A method of maintaining a class hierarchy of an object-oriented data model in tables of a relational database, comprising:

accessing, by an object-relational mapping system executing on an electronic device, the class hierarchy of the object-oriented data model, the class hierarchy including a base class and a plurality of subclasses;

generating a plurality of tables of the relational database on a storage device, the plurality of tables including one or more initial tables and an overflow table;

mapping, by the object-relational mapping system, the base class and subclasses to the one or more initial tables and the overflow table, wherein the mapping maps properties to columns of the one or more initial tables until a column threshold is reached and maps excess properties to columns of the overflow table; and storing properties of the classes of the class hierarchy to the plurality of tables of the relational database according to the mapping.

10. The method of claim 9, wherein the overflow table has a number of columns that exceeds the column threshold.

11. The method of claim 9, wherein the one or more initial tables comprise a primary table and a joined table, and the mapping maps the base class and subclasses to the primary table until a splitting point in the class hierarchy and maps the subclasses after the splitting point in the class hierarchy to the joined table.

12. The method of claim 9, wherein the mapping shares at least one column of the plurality of tables among the base class and the subclasses such that multiple different properties are mapped to the shared column.

13. The method of claim 12, wherein the multiple different properties mapped to the shared column include properties having different data types.

14. The method of claim 9, wherein the object-oriented data model maintains metadata that defines entities of a conceptual schema that models infrastructure.

15. A non-transitory electronic device readable medium having instructions stored thereon, the instructions when executed by one or more processors of a client device or cloud computing system operable to:

access a class hierarchy of an object-oriented data model;

generate a plurality of tables of a relational database, the plurality of tables including a primary table, a joined table and an overflow table, map classes of the class hierarchy to the primary table, joined table and overflow table of the relational database, wherein the mapping maps properties of classes of the class hierarchy to columns of the primary table and joined table until a column threshold is reached in the primary table and joined table and then maps excess properties to columns of the overflow table, and the mapping shares at least one column of the primary table, joined table or overflow table among the classes such that multiple different properties are mapped to the shared column; and store properties of the classes of the class hierarchy to the plurality of tables of the relational database according to the mapping.

16. The non-transitory electronic device readable medium of claim 15, wherein the overflow table has a number of columns that exceeds the column threshold.

17. The non-transitory electronic device readable medium of claim 15, wherein the multiple different properties mapped to the shared column include properties having different data types.

18. The non-transitory electronic device readable medium of claim 15, wherein a number of columns of the primary table, joined table and overflow table are based upon a number of different properties of a class that has a largest number of different properties of the classes of the class hierarchy.

19. The non-transitory electronic device readable medium of claim 15, wherein the object-oriented data model maintains metadata that defines entities of a conceptual schema that models infrastructure.

20. The non-transitory electronic device readable medium of claim 15, wherein the column threshold is 63 columns.

* * * * *